United States Patent [19]

Bingham

[11] 4,190,805
[45] Feb. 26, 1980

[54] COMMUTATING AUTOZERO AMPLIFIER

[75] Inventor: David Bingham, Los Altos, Calif.

[73] Assignee: Intersil, Inc., Cupertino, Calif.

[21] Appl. No.: 861,525

[22] Filed: Dec. 19, 1977

[51] Int. Cl.² .................................................. H03F 1/02
[52] U.S. Cl. ............................................ 330/9; 330/51;
330/69
[58] Field of Search ............................. 330/9, 51, 69

[56] References Cited

U.S. PATENT DOCUMENTS

| 3,939,435 | 2/1976 | Suzuki | 330/51 |
| 3,982,196 | 9/1976 | Poujois | 330/51 X |
| 4,048,574 | 9/1977 | Barbier et al. | 330/9 |

Primary Examiner—Lawrence J. Dahl
Attorney, Agent, or Firm—Alvin E. Hendricson

[57] ABSTRACT

An active analog signal processing system preferably embodied as an integrated circuit includes a pair of like amplifiers which are alternately switched between a first signal processing mode and a second zeroing mode in which a capacitor in the amplifier circuit is reverse charged to a voltage level equivalent to the average noise voltage level of the system whereby the system automatically cancels the low frequency noise thereof to provide a simple low noise processing system.

7 Claims, 8 Drawing Figures

COMMUTATING AUTOZERO AMPLIFIER

BACKGROUND

Many electrical systems which must operate upon very low level signals experience difficulty with low frequency noise signals. Active processing systems requiring the input of power employ amplifiers for signal processing as distinguished from passive elements, such as capacitors and resistors. Active systems unfortunately also generate low frequency noise signals or voltages and at least operational amplifiers commonly employed therein generate "DC offset voltages" so as to partially mask or interfere with the signals processed thereby.

Conventional systems employed for reducing noise and DC offset require complex systems, such as chopper amplifiers or chopper stabilized amplifiers, for example, which are quite complicated and costly. The necessity of meeting and solving the problem of low frequency noise in low power signal circuits has led the art into highly complex systems which are obviated by the present invention.

SUMMARY OF INVENTION

The present invention includes a pair of like parallel channels containing active elements, such as amplifiers, together with switching and feedback means for alternately connecting each channel for signal processing and for automatic zeroing. The present invention is herein described with respect to an operational amplifier system, however, the invention is also applicable to other active processing systems.

An operational amplifier system in accordance with the present invention includes two like operational amplifiers with a capacitor connected in the non-inverting input of each amplifier. Switching means are provided for alternately connecting each of the amplifiers in a processing mode between input and output terminals and a zeroing mode disconnecting the amplifiers from input and output terminals and resistively coupling the amplifier output through the capacitor to the non-inverting input of the amplifier in such a manner as to charge the capacitor to the average low frequency noise level voltage and offset voltage of the amplifier with a polarity opposite to that of the input signals. As the amplifiers are alternately switched to the processing mode, the capacitor voltage cancels the low frequency noise voltage and offset voltage to thus provide a truly low noise amplifier. The present invention is particularly adapted for integrated circuit manufacture and the system is capable of reducing noise by three orders of magnitude, i.e. 1000 times.

The system of the present invention is directed to the reduction of low frequency noise which may be defined as unwanted signals having a frequency between $f_1$ and $f_2$, where $f_1$ may be zero for DC voltages and $f_2$ is some frequency higher than $f_1$ but below the switching or commutating rate of the system. It is noted that this definition includes DC voltages in the low frequency noise and thus the general term low frequency or LF noise is employed herein to include DC offset voltage, for example.

DESCRIPTION OF FIGURES

The present invention is illustrated as to particular preferred embodiments in the accompanying drawings wherein.

DESCRIPTION OF PREFERRED EMBODIMENT

The present invention is directed to the reduction of low frequency noise in an active analog signal processing system. Low frequency noise is herein taken to include zero frequency signals, i.e. "DC voltages" and other unwanted signals having a frequency less than the switching frequency or commutating frequency of the present invention. Active processing systems include systems employing amplifying devices for processing signals and which require an input of power for operation, as distinguished from purely passive systems consisting only of passive elements, such as resistors and compacitors.

Figure 1:
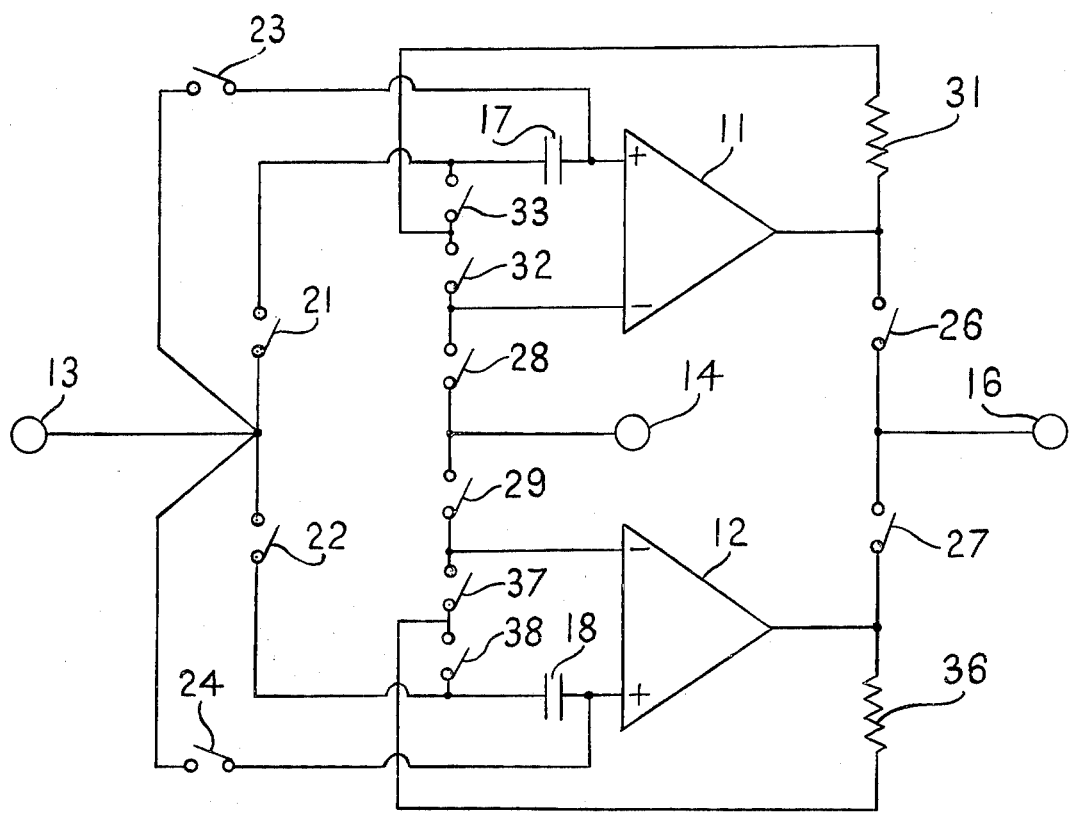
FIG. 1 is a schematic circuit diagram of an operational amplifier system in accordance with the present invention.

In FIG. 1 of the drawings, there is illustrated a system in accordance with the present invention comprising first and second operational amplifiers 11 and 12, respectively. The system of FIG. 1 includes a non-inverting or plus input terminal 13, and an inverting or a minus terminal 14 together with an output terminal 16. It will also be appreciated that the operational amplifiers 11 and 12 are connected to a suitable power supply, now shown.

The system of FIG. 1 operates to commutate or switch each of the operational amplifiers between a processing mode and an autozero mode. Thus, at all times, one of the amplifiers is connected between inputs and outputs of the circuit, while the other amplifier is being automatically zeroed. A first capacitor 17 is connected to the non-inverting input of the operational amplifier 11, and a second capacitor 18 is connected to the non-inverting input of the amplifier 12. In the autozero mode, these capacitors are charged to a voltage equal to the equivalent low frequency noise voltage which is then employed to cancel out the low frequency noise during the subsequent period of the processing mode.

Referring further to the schematic illustration of FIG. 1, it will be seen that the non-inverting input terminal 13 is connected through a switch 21 to one side of the capacitor 17 which has the other side thereof directly connected to the non-inverting input of the operational amplifier 11. The input terminal 13 is similarly connected through a switch 22 to one side of the capacitor 18 which has the other side thereof directly connected to the non-inverting input of the operational amplifier 12. The non-inverting input of the operational amplifiers 11 and 12 are also connected through switches 23 and 24, respectively, to an autozeroing signal source, such as the input terminal 13. The output of the operational amplifier 11 is connected through a switch 26 to the output terminal 16 and the output of the operational amplifier 12 is connected through another switch 27 to the output terminal 16. The inverting input terminal 14 is connected through a switch 28 to the inverting input of the operational amplifier 11 and through another switch 29 to the inverting input of the operational amplifier 12. The system of FIG. 1 furthermore provides a resistor 31 connected from the output of the operational amplifier 11 to the inverting input of the operational amplifier 11 through a switch 32 and to the non-inverting input of the operational amplifier 11 through a switch 33 connected in series with the capacitor 17. A like resistor 36 is connected from the output of the operational amplifier 12 to the inverting input of this amplifier through a switch 37 and to the non-inverting input of this amplifier through a switch 38 connected in series with the capacitor 18.

The switches of FIG. 1 are divided into two sets or groups with all switches of each group being ganged together for simultaneously closing and opening all switches of the group. The first group of switches comprise switches 21, 24, 26, 28, 37 and 38, and the second group of switches comprise switches 22, 23, 27, 29, 32 and 33. One group of switches is closed, while the other group of switches is open, and vice versa. The rate at which this switching occurs is herein termed the commutating frequency which will be seen to comprise the rate at which each amplifier is switched from an autozero mode to a signal processing mode and vice versa. Autozeroing or the autozero mode comprises the mode wherein a capacitor is charged to the average noise level as further described below.

Figure 2A:
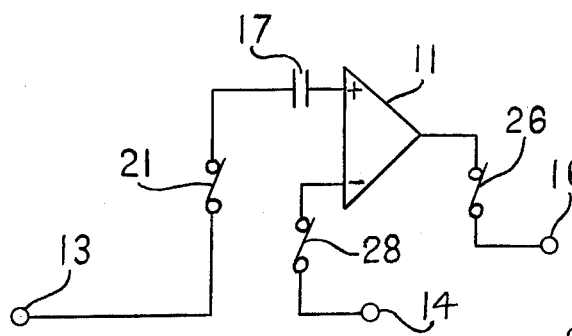
FIGS. 2A and 2B are circuit diagrams of the first and second amplifiers of FIG. 1 in one condition of operation.
Figure 3A:
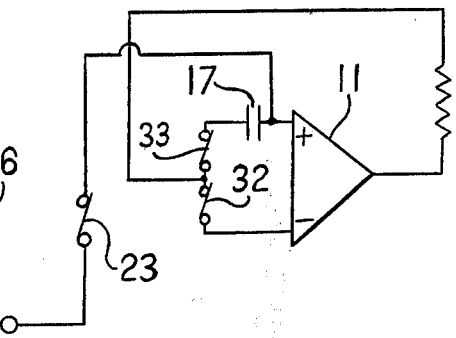
FIGS. 3A and 3B are circuit diagrams of the first and second amplifiers of FIG. 1 in a second condition of operation.
Figure 2B:
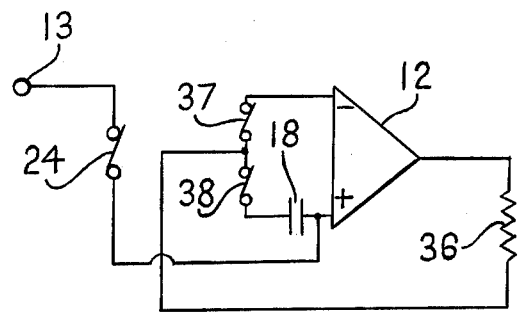
Figure 3B:
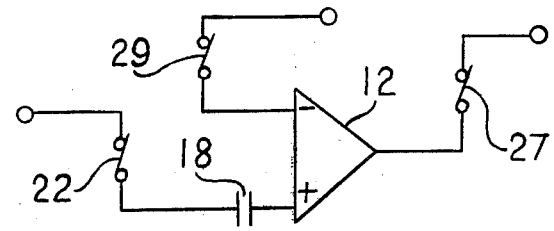

Operation of the circuit of FIG. 1 is accomplished by alternately opening and closing the switches of groups 1 and 2 at the commutating frequency with all switches of group 1 being opened when all switches of group 2 are closed, and vice versa. This operation is further illustrated in FIGS. 2 and 3 showing only the completed circuits during alternate operation of the groups of switches. Referring to FIG. 2A, it will be seen that the operational amplifier 11 is connected in a signal processing mode wherein the closure of switches 21, 26 and 28 connects the input terminal 13 through the capacitor 17 to the non-inverting input of the amplifier 11, the inverting input terminal 14 is connected to the inverting input of the amplifier 11 and the output of the amplifier 11 is connected to the output terminal 16. At the same time, switches 24, 27 and 38 of group 1 are also closed, and, as shown in FIG. 2B, this causes the non-inverting input terminal 13 to be directly connected to the non-inverting input of the amplifier 12 and the output of this amplifier to be connected through the resistor 36 to the inverting input of the amplifier and through the capacitor 18 to the non-inverting input. The amplifier 12 will thus be seen to be connected in a DC unit gain mode with the difference in voltage between the output of the amplifier and the non-inverting input being employed to charge the capacitor 18 over a finite period of time during which this amplifier is in the autozero mode, as illustrated in FIG. 2B. The voltage on the capacitor 18 is equal to the DC offset voltage of the amplifier 12 and the instantaneous low frequency noise component and the average high frequency noise component. The low frequency noise component is taken as a noise voltage below a frequency approximately equal to 1/RC where R is measured in ohms, C is measured in farads, and the commutating frequency is less than 1/RC. At the end of one-half of the commutating cycle, the switches of group 1 are opened, and the switches of group 2 are closed so that the first amplifier 11 is switched to the autozero mode, as shown in FIG. 3A, and the second operational amplifier 12 is switched to the signal processing mode, as illustrated at FIG. 3B. The capacitor 18 of the amplifier 12 which was previously charged to a voltage equal to the average value of the input noise will be seen to be placed in series with the non-inverting input of the amplifier so that the non-inverting input is offset in an opposite sense or polarity by the average value of the input noise voltage. It is noted that the average value of the equivalent input noise averages over about one-half of the commutating cycle. This offsetting of the non-inverting input of the amplifier by the charge in the capacitor 18 will thus be seen to substantially cancel out the equivalent input noise. During signal processing by amplifier 12, as shown in FIG. 3B, the other amplifier 11 is in the autozero mode, as shown in FIG. 3A, so that during the succeeding half cycle of the commutating frequency, the charge on capacitor 17 offsets the input noise voltage during signal processing by the amplifier 11. In this manner, the present invention provides for cancelling or removing substantially all of the input noise voltage.

Figure 4:
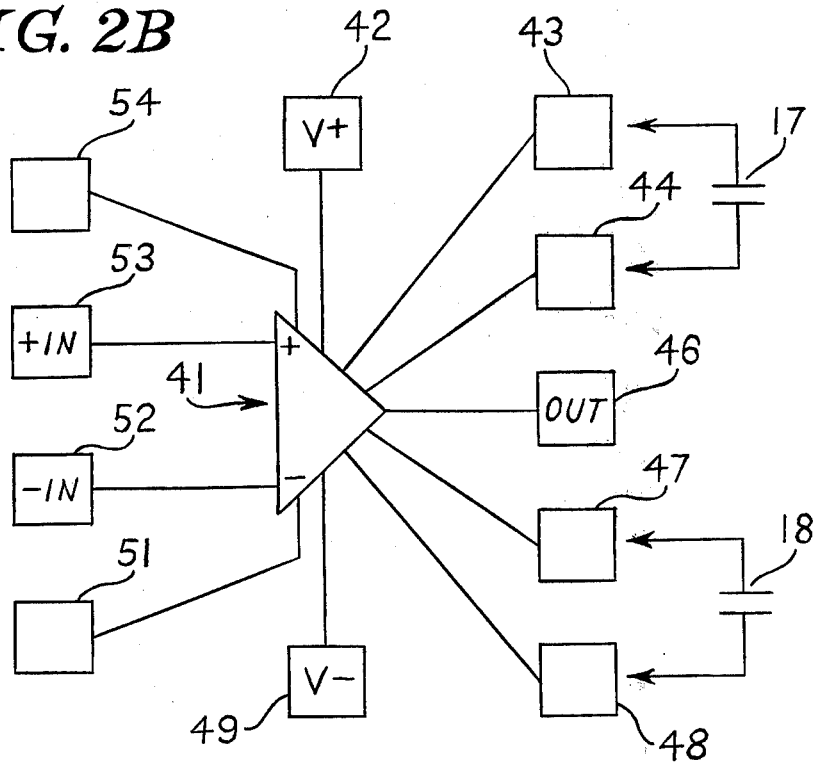
FIG. 4 is a block diagram of an integrated circuit embodiment of the present invention with contact pads and external capacitors.

The present invention is particularly adapted to be formed as an integrated circuit or as a part of a larger integrated circuit system. One inexpensive method of large scale production of the present invention is a CMOS unit that may be packaged in a standard package normally employed in the semi-conductor industry, such as the 14 lead dual inline package wherein two external capacitors are adapted to be connected to leads of the packaged unit. In FIG. 4 of the drawings, there is schematically illustrated a CMOS integrated circuit unit 41 in accordance with the present invention, and this figure illustrates 11 contacts connected thereto that may, for example, comprise 11 of the leads of a 14 lead package. Proceeding in clockwise direction about the CMOS IC from atop thereof, there is shown a contact 42 for V+ and first and second capacitor contacts 43 and 44 for the capacitor 17 of the circuit of FIG. 1. This capacitor 17 is adapted to be provided as an element external to the package and connected across the contacts or leads 43 and 44, as indicated by the arrows in FIG. 4. An output contact 46 is next shown and there then follows capacitor contacts 47 and 48 across which there is adapted to be connected the external capacitor 18 of FIG. 1. There next follows a contact 49 for V− and a further contact 51 adapted to receive a signal alternating at the commutator frequency for operating the groups of switches of the circuit 41, as described above. A contact or lead 52 is provided for the inverting input 41, and a further contact 53 is provided for the non-inverting input 41. In FIG. 4 there is additionally illustrated a contact 54 which may be provided for the application of an autozeroing signal to the unit 41 under the circumstances wherein the signal is not applied from the non-inverting input terminal. It is noted in this respect that the switches 23 and 24 in the circuit of FIG. 1 need not be connected to the non-inverting input terminal 13, but instead, could be connected to another input terminal herein denominated as the autozeroing terminal or contact 54. The illustration of FIG. 4 of the drawings is merely indicative of a possible embodiment of the present invention wherein the system hereof may be packaged in a conventional semiconductor package normally employed in the field and wherein the unit 41, illustrated in FIG. 4 comprises the present invention, except for the external capacitors 17 and 18, as shown in this figure.

Figure 5:
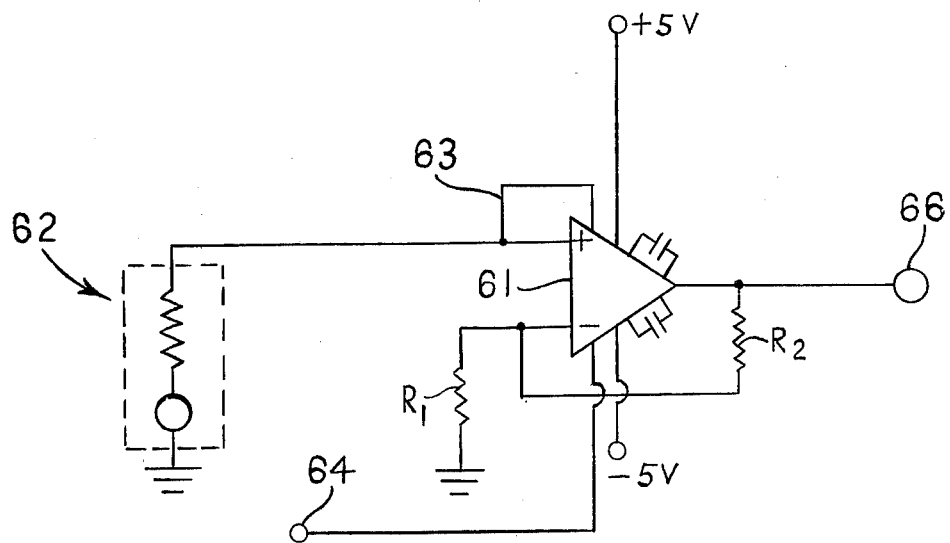
FIG. 5 is a diagram of a microvolt thermocouple amplifier application of the present invention.

The present invention is adapted for utilization in a wide variety of different systems wherein low noise signal processing is important. A typical application of the present invention might comprise a low microvoltage thermocouple temperature amplifier. In FIG. 5, there is illustrated such an application of the present invention wherein the unit 61 comprises a system in accordance with the present invention and having a non-inverting input connected through a thermocouple 62 to ground and an inverting input grounded through a resistor $R_1$ and coupled to the output by a resistor $R_2$. This system provides a gain of $(R_1+R_2)/R_2$ which may be about 100 for a $\mu V$ thermocouple amplifier. This amplifier is suitable for measurement accuracies less than 1° C. It will be appreciated that the amplification $A=100$ is obtained by $A=(R_1+R_2)/R_2=100$, so that $R_2=99R_1$ and with the assumption that $R_1=10K$, $R_2=990K$. For this application of the present invention, a simple CMOS operational amplifier formed in accordance herewith would have the DC offset voltage nulled and the device should be selected for offset drift having a value of the order of 1 $\mu V/°C$. or less.

In FIG. 5 there is illustrated an autozeroing connection 63 which is separated from the non-inverting input for greater flexibility of circuit operation. In this figure, a terminal 64 is adapted to receive a signal alternating at the commutating frequency for alternately operating the groups of switches of the circuit 61, and there is also shown to be provided an output terminal 66 whereat the amplified signal representing temperature measured by the thermocouple 62 appears.

The present invention may be physically embodied in a variety of different ways, including the connection of discreet components, however, one of the preferable technologies for implementing an integrated CAZ amplifier, in accordance herewith, comprises a CMOS integrated circuit utilizing complimentary MOS technology. Such an embodiment is illustrated in FIG. 6 of the drawings wherein external contacts or leads are numbered the same as in FIG. 1.

Figure 6:
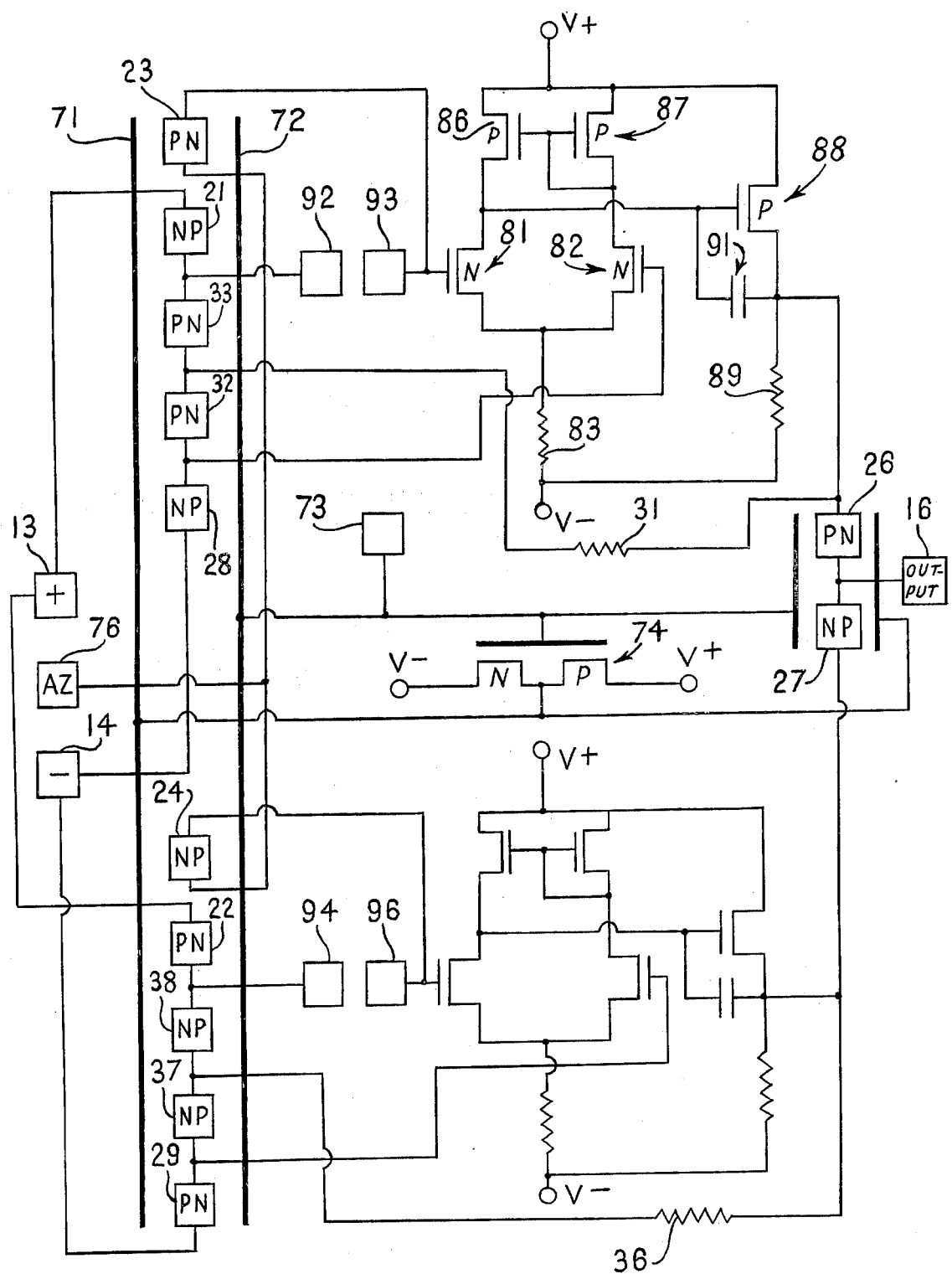
FIG. 6 is a diagram of a CMOS integratable amplifier in accordance with the present invention.

In FIG. 6 of the drawings, there is illustrated an implementation of the present invention in CMOS and the switches of FIG. 1 are provided as complimentary switches. Each switch consists of a P and N channel pair of transistors connected in parallel. This parallel combination provides a closed switch if the voltage on the gate of the P channel transistor is connected to a negative supply, and the voltage on the gate of the N channel transistor is connected to a positive supply. The combination is the equivalent of an open switch with gate voltages reversed from the foregoing. In the circuit of FIG. 6, the switches of FIG. 1 are illustrated to be formed as complimentary switches and are shown in a vertical row with the same identification number as in FIG. 1. It will be noted that only two gate electrodes 71 and 72 need to be provided for this row of switches with the gate electrode 72 being connected to a commutating terminal 73 applying switching signals at a predetermined commutating rate to the electrode 72. The other electrode 71 is connected through a MOS inverter 74 to the commutating terminal 73. The gate electrode 72 thus receives the commutating signal and the electrode 71 receives the inverse of the commutating signal to consequently operate the switches in the groups, as described in relation to FIG. 1. In FIG. 6, an autozeroing terminal 76 is shown to be separated from the non-inverting input terminal 13 rather than being connected thereto, although it will be appreciated that this connection may be made, if desired. This autozeroing terminal 76 will be seen to be connected to the non-inverting inputs of MOS amplifier circuits through the switches 23 and 24.

The upper operational amplifier of FIG. 6 is formed of an input N-channel transistor differential pair 81 and 82 biased by resistor 83. The outputs from the transistors 81 and 82 are applied to P-channel transistor current mirrors 86 and 87. The outputs drive a second stage transistor 88 biased by the resistor 89 and which is connected through the switch 26 to the output terminal 16. It is noted that the switches 26 and 27 are operated in the same manner as the other switches in the circuit, with gate electrodes being connected to the commutating signal and inverse of the commutating signal. There is also provided a capacitor 91 connected across the output transistor 88 for compensating the amplifier so that the phase angle of a signal measured between the inputs of the amplifier and outputs thereof does not exceed 90 degrees up to a frequency where the open loop gain of the amplifier equals unity.

In FIG. 6, there are shown contacts 92 and 93 connected between the gate of transistor 81 and the output of switch 21 for the purpose of connecting an external capacitor thereacross. This external capacitor, now shown in FIG. 6, corresponds to the capacitor 17 of FIG. 1 and is provided for the purpose of storing noise voltage, as previously described. Similar contacts 94 and 96 are provided in the non-inverting input circuit of the lower amplifier for the connection of an external capacitor corresponding to the capacitor 18 of FIG. 1. The lower or second operational amplifier in FIG. 6 is identical to the first amplifier described below, and thus no further description thereof is included herein.

The circuit illustrated in FIG. 6 and briefly described above is noted to comprise only one possible manner of implementing the present invention. Alternative switching arrangements are possible, for example, as well as alternative amplifiers and alternative device implementation, such as the use of bipolar transistors, vacuum tubes, mechanical switches, or the like. Implementation of the present invention as an integrated circuit is, however, quite advantageous. It is also noted that the commutating frequency of the present invention may be chosen by the circuit designer and varied for different applications. In the circuit of FIG. 6, the commutating terminal 73 may be supplied with a signal of 100–1000 hertz, for example, with a signal amplitude equal to the total supply voltage i.e. $V^+$ to $V^-$, and approximately a 50 percent duty cycle. The commutation frequency determines the upper limit of the instantaneous low frequency noise component that is cancelled out in the present invention and consequently, this should be borne in mind in choosing the commutating frequency.

The present invention has been described with respect to particular preferred embodiments thereof, however, it has been noted and will be apparent to those skilled in the art that numerous modifications and variations are possible within the scope of the present invention. It is consequently not intended to limit the present invention to the precise terms of description or details of illustration.

I claim:

1. An active analog processing system comprising
first and second like signal processing circuits with each having first and second inputs,
a capacitor connected to the first input of each of said circuits,
input terminals and an output terminal,
switching means operable to alternately connect each of said circuits between said input and output terminals through said capacitors, and said switching means also being operable to alternately disconnect said circuits from said terminals and resistively couple the output of the disconnected circuit to the first input through the said capacitor thereof and to the second input and to connect the first circuit input directly to a low impedence reference source, such as the input terminal of the system or a ground reference of the system for charging the capacitor with a voltage having a polarity to substantially cancel input low frequency noise, and
means operating said switching means at a predetermined frequency of operation whereby signals applied to the system are alternately passed by said circuits and the circuits are alternately zeroed by charging of the capacitors thereof to minimize the transmission of noise signals by the system.

2. The system of claim 1 further defined by said signal processing circuits comprising amplifiers.

3. The system of claim 2 further defined by said amplifiers and switches being comprised of integrated circuit MOS devices.

4. The system of claim 2 further defined by each of said amplifiers having inverting and non-inverting inputs with said capacitors being connected to the non-inverting inputs.

5. The system of claim 2 further defined by said switches being formed as integrated circuit complimentary MOS devices with common gate electrodes for a plurality of devices for simultaneously switching thereof at said predetermined frequency.

6. A low noise amplifier system comprising
first and second like amplifiers with each amplifier having an output and inverting and non-inverting inputs,
a pair of capacitors connected one to each amplifier at the non-inverting input thereof,
inverting and non-inverting input terminals and an output terminal,
first and second switches connecting the outputs of said amplifiers to said output terminal,
third and fourth switches connecting said non-inverting input terminal to the non-inverting inputs of said first and second amplifiers respectively through said capacitors,
fifth and sixth switches connecting said inverting input terminal to the inverting inputs of said first and second amplifiers respectively,
seventh and eight switches connecting said non-inverting input terminal directly to the non-inverting inputs of said first and second amplifiers respectively,
ninth and tenth switches resistively coupling the output of the first of said amplifiers to the inverting input thereof and through said capacitor to the non-inverting input thereof,
eleventh and twelfth switches resistively connecting the output of the second amplifier to the inverting input thereof and through said capacitor to the non-inverting input thereof, and
commutating means alternately closing a first group of switches comprising said first, third, fifth, eight, eleventh and twelfth switches while opening a second group of switches comprising the remaining switches and then opening the first group of switches while closing the second group of switches.

7. The system of claim 6 further defined by said commutating means alternating the opening and closing of said groups of switches at a frequency in excess of the upper frequency of low frequency noise signals to be cancelled out by the present invention.

* * * * *